(12) United States Patent
Park

(10) Patent No.: US 6,197,670 B1
(45) Date of Patent: Mar. 6, 2001

(54) METHOD FOR FORMING SELF-ALIGNED CONTACT

(75) Inventor: Byung-Jun Park, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/362,501

(22) Filed: Jul. 30, 1999

(30) Foreign Application Priority Data

Aug. 6, 1998 (KR) .................................................. 98-32086

(51) Int. Cl.[7] ................................................. H01L 21/283
(52) U.S. Cl. ........................ 438/586; 438/597; 438/618; 438/624; 438/637; 437/195
(58) Field of Search .................................. 438/584, 618, 438/620, 637, 638, 639; 437/195, 189, 228; H01L 21/283

(56) References Cited

U.S. PATENT DOCUMENTS

| | | | |
|---|---|---|---|
| 5,296,400 | * 3/1994 | Park et al. | 437/52 |
| 5,413,961 | * 5/1995 | Kim | 437/195 |
| 5,422,315 | * 6/1995 | Kobayashi | 437/228 |
| 5,439,848 | * 8/1995 | Hsu et al. | 437/195 |
| 5,670,404 | * 9/1997 | Dai | 437/52 |
| 5,985,711 | * 11/1999 | Lim | 438/229 |

* cited by examiner

Primary Examiner—Don Wong
Assistant Examiner—Hoang Nguyen
(74) Attorney, Agent, or Firm—Jones Volentine, LLC

(57) ABSTRACT

A method for forming a self-aligned contact includes forming a second insulating layer, on a first insulating layer including a first self-aligned contact pad formed on a semiconductor substrate, forming a conductive architecture on the second insulating layer, and forming a second self-aligned contact pad on both sides of the conductive architecture. The conductive architecture is covered with a material layer having an etch selectivity with respect to the second insulating layer and the second self-aligned contact pad is electrically connected to the first self-aligned contact pad. Thus, a self-aligned contact pad is formed with two layers. Accordingly, the contact is self-aligned to a gate electrode and a bit line, thereby preventing shorts generated by misalignment. Further, the etching thickness is reduced while etching an oxide layer to form a storage node contact hole, thereby suppressing shorts and reducing the critical dimension of a storage node contact. As a result, it is possible to insure misalignment margin to a storage node.

7 Claims, 11 Drawing Sheets

METHOD FOR FORMING SELF-ALIGNED CONTACT

FIELD OF THE INVENTION

The present invention relates to a method for fabricating a semiconductor device, and more particularly to a method for forming a self-aligned contact of a DRAM (dynamic random access memory).

BACKGROUND OF THE INVENTION

The high integration of a DRAM (dynamic random access memory) device leads to a decrease of the cell pitch size. It is therefore important to insure misalignment margin in a fabricating process of a Gigabit DRAM and less.

Owing to the limitation of photolithography and etching techniques, it is the most important and difficult to insure misalignment margin of a storage node contact to a gate electrode, a bit line, and a storage node during formation of a cell.

Referring to FIG. 1A, by forming a shallow trench isolation 12 on a semiconductor substrate 10, an active region and an inactive region are defined. A conductive layer (that is, gate electrode) is formed on the active region. The gate electrode has a structure that a silicide layer is layered on a polysilicon layer. A top surface and both sidewalls of the gate electrode are covered with a nitride layer spacer. A first oxide layer 14 as an insulating layer is formed to cover up the semiconductor substrate 10 including the trench isolation 12.

Then, a self-aligned contact (referring to below as SAC) process is performed. That is, using a contact hole formation mask, the first oxide layer 14 on the active region is etched to form a pad formation contact hole. After filling the contact hole with a polysilicon layer, the polysilicon layer is planarized to be coplanar with the first oxide layer 14 through a CMP (chemical mechanical polishing) process. As a result, a storage node contact pad 16 which is electrically connected to the semiconductor substrate 10 is formed. Simultaneously is formed a bit line contact pad (not shown) connecting a bit line to the semiconductor substrate 10 in a following process.

Referring to FIG. 1B, a second oxide layer 18 is formed on the first oxide layer 14 including the storage node contact pad 16. The second oxide layer is made of, for example, P-TEOS (plasma-tetraethylorthosilicate) with a thickness of about 1,000 Å. Using a contact hole formation mask, the second oxide layer 18 is etched to form a bit line contact hole (not shown).

A bit line 20 which is electrically connected to the bit line contact pad via the bit line contact hole is formed. A third oxide layer 22, a nitride layer 24, and a fourth oxide layer 26 are sequentially formed on the second oxide layer 18 including the bit line 20. When a capacitor dielectric film is formed in the following process, $O_2$ is created to oxidize the bit line 20. The nitride layer 24 may suppress the oxidation of the bit line 20. The total thickness of the second oxide layer 18, the third oxide layer 22, the nitride layer 24, and the fourth oxide layer 26 is about 6,000 Å.

Referring to FIG. 1C, the fourth oxide layer 26, the nitride layer 24, the third oxide layer 22, and the second oxide layer 18 are sequentially etched down to a top surface of the storage node contact pad 16 by using a contact hole formation mask. Thus, a storage node contact hole 27 is formed. If the mask is misaligned, it is possible to generate a short between the bit line and a storage node contact formed in the following process.

Referring to FIG. 1D, a storage node formation conductive layer is formed on the fourth oxide layer 26 including the foregoing storage node contact hole 27 as high as the height of a storage node. Using a storage node formation mask, the conductive layer is patterned to form a storage node 30 which is electrically connected to the storage node contact pad 16.

When the second oxide layer 18 is etched to form the bit line contact hole, the etching thickness of the oxide layer is relatively thin (about 1,000 Å) and as soon as a contact pad is formed, the bit line is formed. Therefore, it is not difficult to align to the contact pad.

However, there can arise some problems associated with alignment between the contact pad and the storage node. For example, it is very difficult to form a buried contact (storage node contact 28) by etching a thick nitride layer (e.g., about 6,000 Å). Furthermore, when aligning the storage node contact 28 to the underlying corresponding contact pad, various layers such as a gate electrode line, bit line contact, bit line and storage node serve as obstacles and they must be taken into account. As a result, it is very difficult to ensure enough mis-alignment margin (alignment tolerance) exceeding 50 nm.

However, generally mis-alignment margin between the gate electrode and the storage node contact is less than 40 nm and mis-alignment margin between a bit line and storage node contact is less than 40 nm. The 0.15 nm cell pitch requires storage node contact dimension of 100 nm at the top portion and 80 nm at the bottom portion thereof, but the critical dimension of the storage contact is increased due to the fact that layer to be etched is about exceeding 6,000 Å and sufficient overetch process is needed. Therefore, the mis-alignment margin between the storage node and storage node contact becomes very narrow, for example, less than 20 nm.

Accordingly, there is a need for a method which can provide a sufficient mis-alignment margin between the storage node contact and the storage node without producing an electrical bridge.

SUMMARY OF THE INVENTION

It is an object of the present invention to provide a method for forming a self-aligned contact which suppresses formation of shorts generated by the misalignment of a gate electrode, and insuring a misalignment margin for a storage node contact to a storage node.

According to a first embodiment the present invention, a first insulating layer is formed on a semiconductor substrate where a transistor is formed. The first insulating layer is penetrated to form a first self-aligned contact pad electrically connected to the semiconductor substrate. A second insulating layer is formed on the first insulating layer including the first self-aligned contact pad. A conductive architecture is formed on the second insulating layer. The conductive architecture is covered with a material layer having an etch selectivity with respect to the second insulating layer. A third insulating layer is formed on the second insulating layer including the bit line. The third insulating layer and the second insulating layer are sequentially etched down to a top surface of the first self-aligned contact pad, so that a first opening is formed. A second self-aligned contact pad is formed electrically connected to the first self-aligned contact pad via the first opening. A fourth insulating layer is formed on the third insulating layer, including the second self-aligned contact pad. The fourth insulating layer is etched down to a top surface of the second self-aligned contact pad, so that a second opening is formed. Finally, a storage node is formed electrically connected to the second self-aligned contact pad via the second opening.

According to a second embodiment of the present invention, a first insulating layer is formed on a semiconductor substrate where a transistor is formed. The first insulating layer is penetrated to form a first self-aligned contact pad electrically connected to the semiconductor substrate. A second insulating layer is formed on the first insulating layer including the first self-aligned contact pad. A conductive architecture is formed on the second insulating layer. The conductive architecture is covered with a material layer having an etch selectivity with respect to the second insulating layer. A portion of the second insulating layer is etched down to a top surface of the first self-aligned contact pad by using a photoresist pattern as a mask. A second self-aligned contact pad is formed in the exposed portion thereof. A pad formation conductive layer is formed on the overall surface of the semiconductor substrate. The conductive layer is planarized down to a top surface of the material layer. The conductive layer is patterned by using a photoresist pattern as a mask, so that the second self-aligned contact pad is formed electrically connected to the first self-aligned contact pad. A third insulating layer is formed on the second insulating layer, including the second self-aligned contact pad. The third insulating layer is etched down to a top surface of the second self-aligned contact pad, to form an opening. A storage node is formed, electrically connected to the second self-aligned contact pad via the opening.

Self-aligned contacts of the present invention comprise a semiconductor substrate where a transistor is formed, multilayer contact pads formed on the semiconductor substrate so as to be electrically connected to the semiconductor substrate, and insulating layers insulating the contact pads.

BRIEF DESCRIPTION OF THE DRAWINGS

The above and other features and aspects of the present invention will become more apparent upon the reading of the following detailed description in conjunction with the accompanying drawings, in which.

DETAILED DESCRIPTION OF PREFERRED EMBODIMENTS

The present invention will be discussed hereinafter in detail in terms of the preferred embodiments of the present invention with reference to the accompanying drawings.

(First Embodiment)

In a self-aligned contact formed according to the first preferred embodiment, an active region and an inactive region are formed on a semiconductor substrate 100. Self-aligned contact pads 106 are formed on the multi-layer semiconductor substrate 100 so as to be electrically connected to the active region. The self-aligned contact pads 106 are insulated by insulating layers 104, 108, and 114.

Figure 1A:
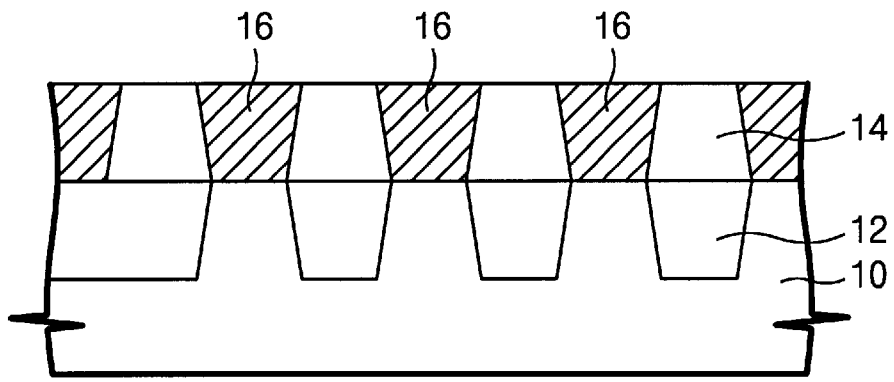
FIGS. 1A–1D are flow diagrams showing the process steps of a prior method for forming a self-aligned contact, viewed along the direction parallel with a word line.
Figure 1B:
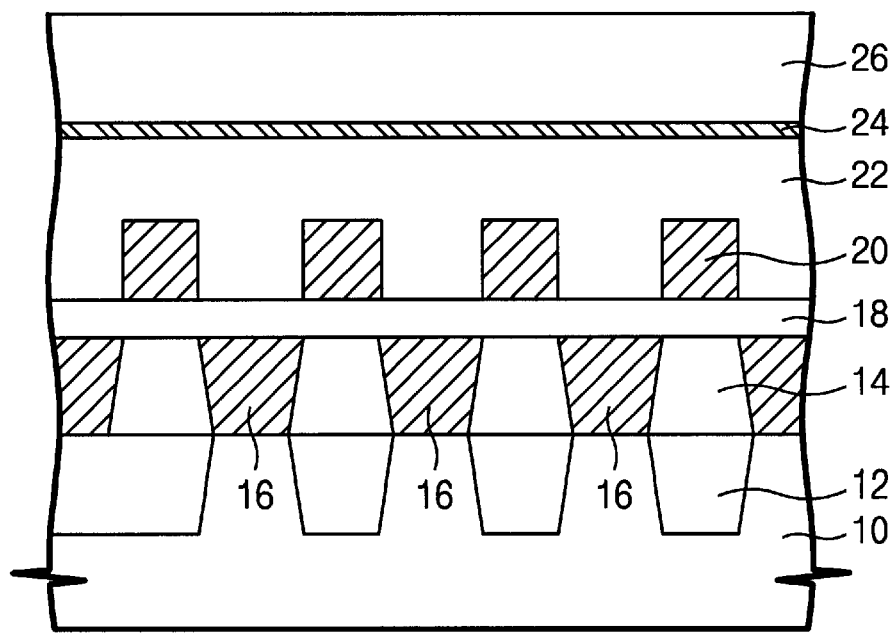
Figure 1C:
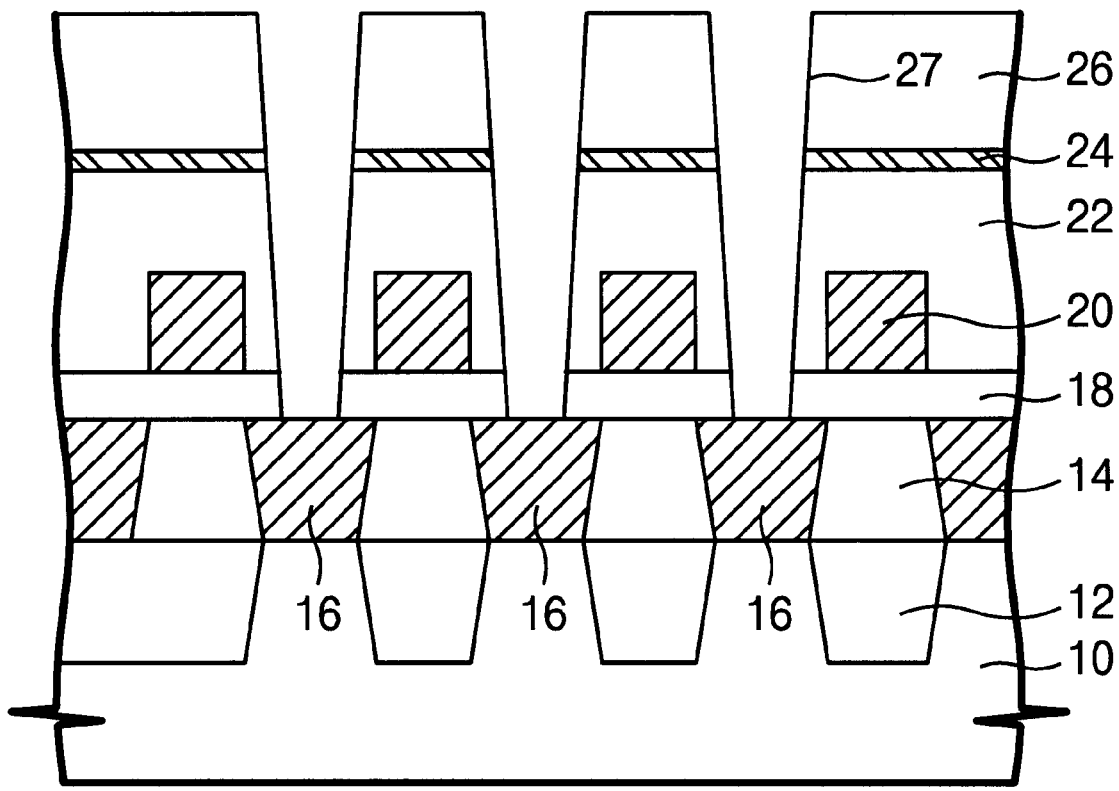
Figure 1D:
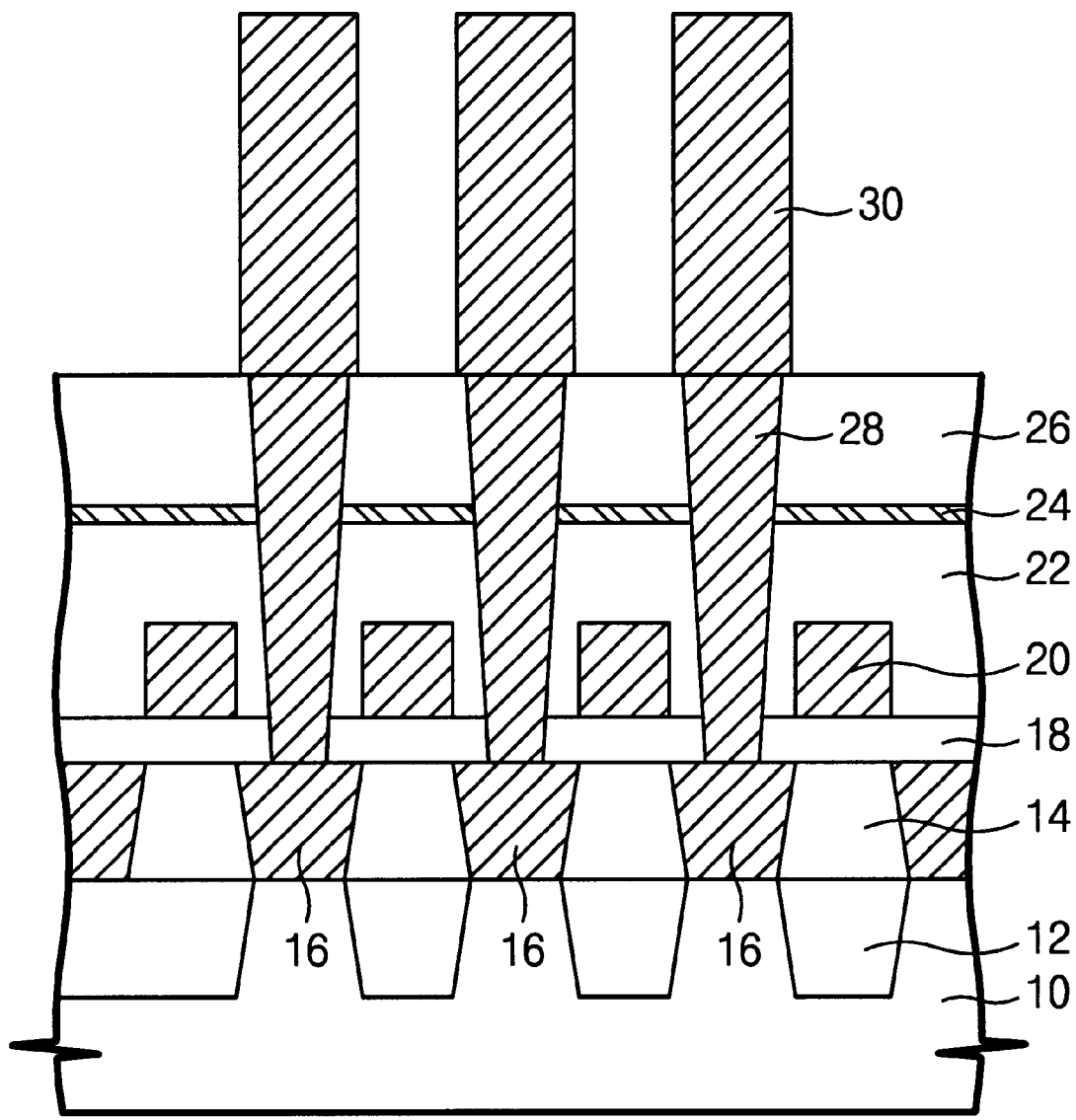
Figure 2A:
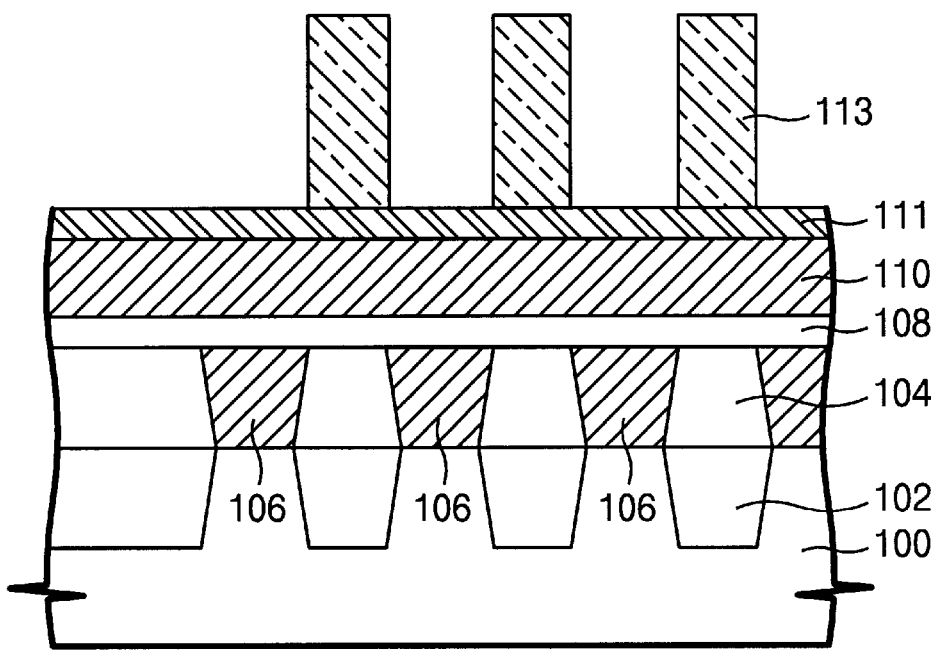
FIGS. 2A–2F are flow diagrams showing the process steps of a method for forming a self-aligned contact according to a First Embodiment, viewed along the direction parallel with a word line.

Referring to FIG. 2A, a trench isolation 102 defining the active region and the inactive region is formed on the semiconductor substrate 100. A gate electrode formation conductive layer (not shown) is formed on a gate oxide layer over the semiconductor substrate 100. The conductive layer has a structure that a silicide layer is layered on a polysilicon layer. A mask nitride layer is formed on the conductive layer. Using a gate electrode formation mask, the mask nitride layer and the conductive layer are sequentially etched to form a gate electrode (not shown).

A nitride layer is formed on the semiconductor substrate 100 including the gate electrode. The nitride layer is etched back to form a gate electrode spacer (not shown) on both sidewalls of the gate electrode. The gate electrode spacer may prevent a pad-to-gate short in the following process of forming a contact pad. Implanting impurity ions into the active region on both sides of the gate electrode, a source/drain region is formed.

A first oxide layer 104 serving as an interlayer insulating film is formed on the semiconductor substrate 100 including the gate electrode. Using a photoresist pattern as a mask, the first oxide layer 104 on both sides of the gate electrode is etched to form a contact hole. After deposition of, for example, a polysilicon layer on the first oxide layer 104 including the contact hole, the polysilicon layer and the first oxide layer 104 are planarized through a CMP (chemical mechanical polishing) process. Then, a first self-aligned contact pad 106 electrically connected to the semiconductor substrate 100 is formed. The mask nitride layer serves as an etch-stop layer.

A second oxide layer 108 is formed on the first oxide layer 104 including the first self-aligned contact pad 106. The second oxide layer 108 is made of P-TEOS (plasma-tetraethylorthosilicate). The second oxide layer 108 is etched down to a top surface of the first self-aligned contact pad 106 by using a bit line contact hole formation mask, so that a bit line contact hole (not shown) is formed.

A bit line formation conductive layer 110 and a mask nitride layer 111 are sequentially formed on the second oxide layer 108 including the bit line contact hole. The conductive layer 110 has a structure that a W layer is layered on a TiN layer or a silicide layer is layered on a polysilicon layer. The nitride layer 111 is made of SiN and serves as an etch-stop layer in the following process.

Figure 2B:
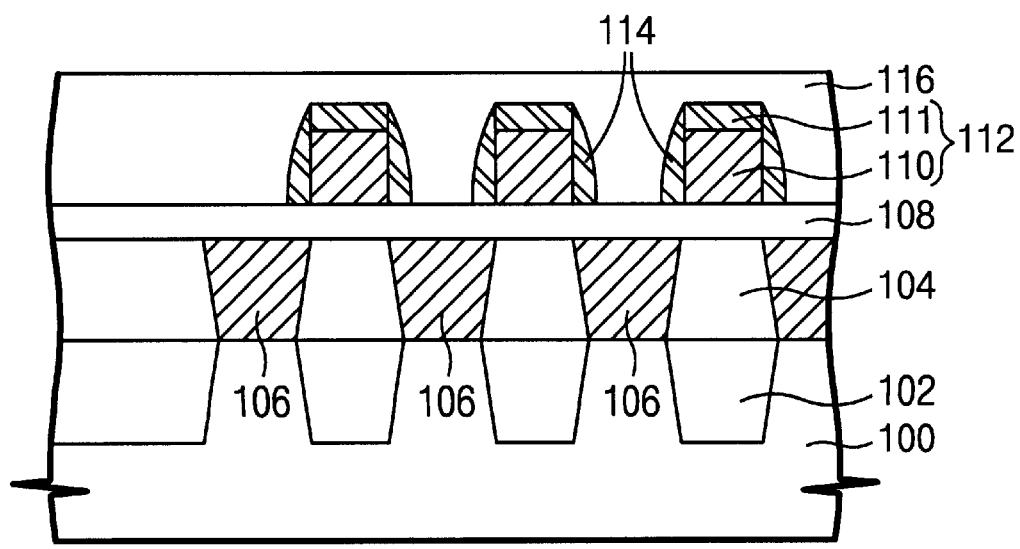

Using a bit line formation mask 113, the mask nitride layer 111 and the conductive layer 110 are sequentially etched to form a bit line electrically connected to the first self-aligned contact pad 106 via the bit line contact, as shown in FIG. 2B. A nitride layer is formed on the second oxide layer 108 including the bit line 112. Anisotropically etching the nitride layer through an etch-back process, a bit line spacer 114 is formed on both sidewalls of the bit line 112. The bit line spacer may prevent a bridge between the bit line conductive layer, and a storage node formed through the following process, and suppress the insulation between a bit line and a contact pad formed through the following process. A third oxide layer 116 is formed on the second oxide layer 108 including the bit line 112.

Figure 2C:
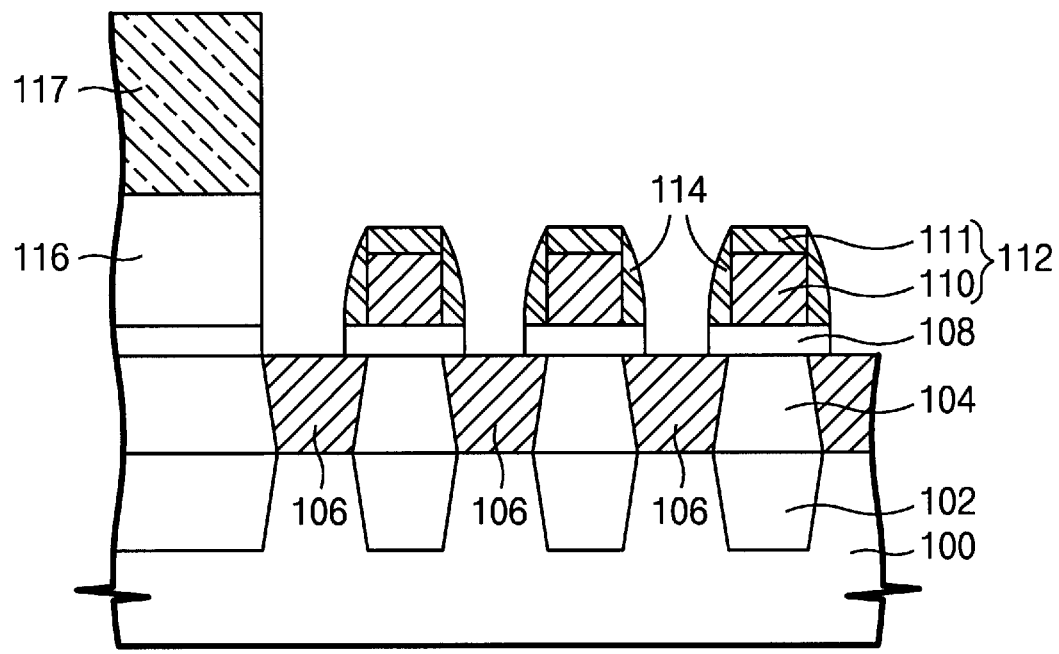
Figure 4:
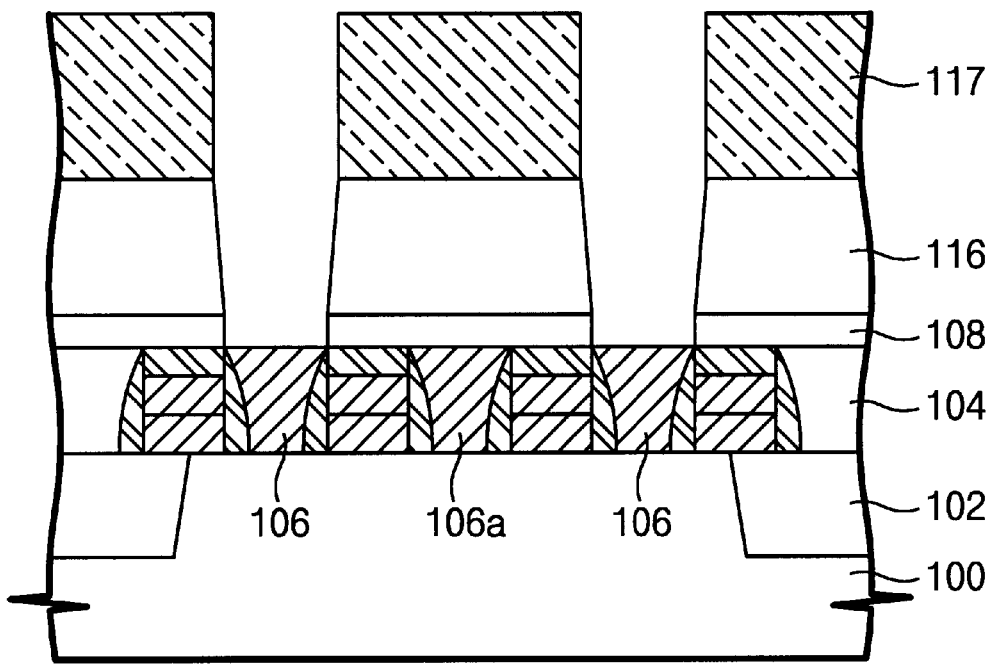
FIG. 4 is a sectional view showing a self-aligned contact according to a First Embodiment, viewed along the direction parallel with a bit line.

Referring to FIG. 2C and FIG. 4, using a photoresist pattern 117 and the mask nitride layer 111 (not shown in FIG. 4) as a mask, the third oxide layer 116 and the second oxide layer 108 are sequentially etched down to a top surface of the first self-aligned contact pad 106. Then, a contact hole is formed. The contact hole forming mask 117 can be a linear type (as shown in FIG. 2C) or a single-contact type. Herein, the linear type means that the contact hole forming mask 117 has a linear configuration opening that exposes a plurality of contact areas, i.e., at least two first self-aligned contact pads. The single-contact type means that the contact hole forming mask has a contact configuration opening that exposes only one contact area, i.e, only one first self-aligned contact pad.

Figure 2D:
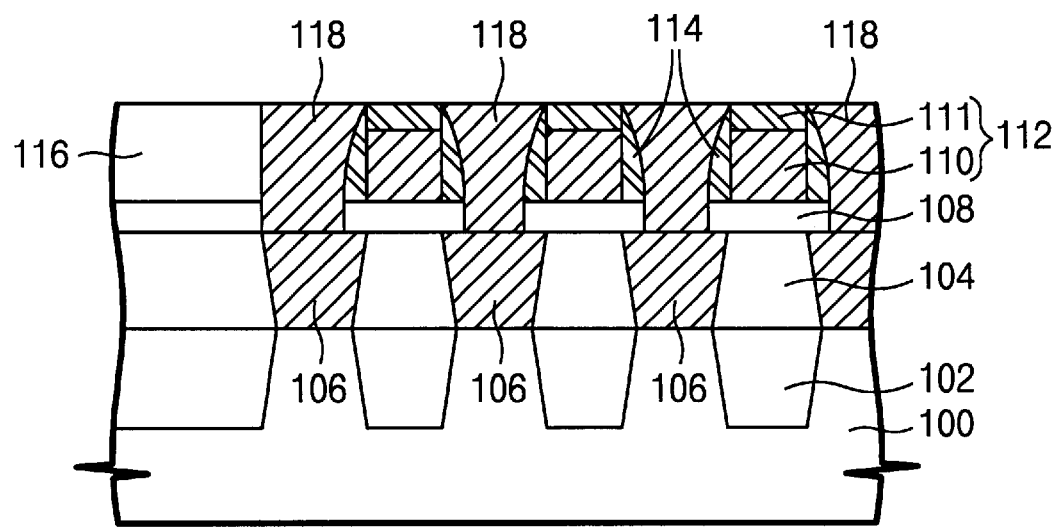

The contact hole formation mask 117 is removed through an ashing process. After filling the contact hole with a polysilicon layer, the polysilicon is planarized down to a top surface of the mask nitride layer 111 through the CMP process. Then, as shown in FIG. 2D, a second self-aligned contact pad 118 is formed electrically connected to the first self-aligned contact pad 106.

Figure 2E:
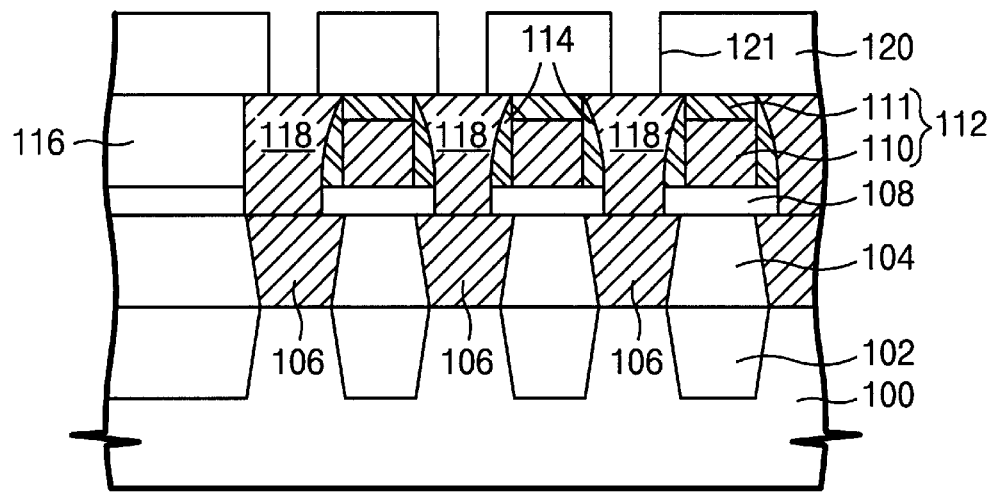

Referring to FIG. 2E, a fourth oxide layer 120 is formed on the third oxide layer 116 including the second self-aligned contact pad 118. The fourth oxide layer 120 is formed with a thickness of about 1,000 to 2,000 Å. Using a contact formation mask, the fourth oxide layer 120 is etched down to a top surface of the second self-aligned contact pad 118. Then, a storage node contact hole 121 is formed. In order to suppress shorts and insure a misalignment margin to a storage node, it is necessary to reduce the etching thickness from 6,000 Å to 1,000–2,000 Å for forming the storage node contact hole 121.

To be brief, a self-aligned contact pad is formed with two layers in the preferred embodiment. Creation of a storage node contact-bit line-gate electrode bridge generated by misalignment while forming a storage node contact hole is therefore prevented. Further, the etching thickness of an insulating layer is reduced to suppress shorts and maintain the required critical dimension of a contact. As a result, it is possible to insure a misalignment margin for a storage node.

Figure 2F:
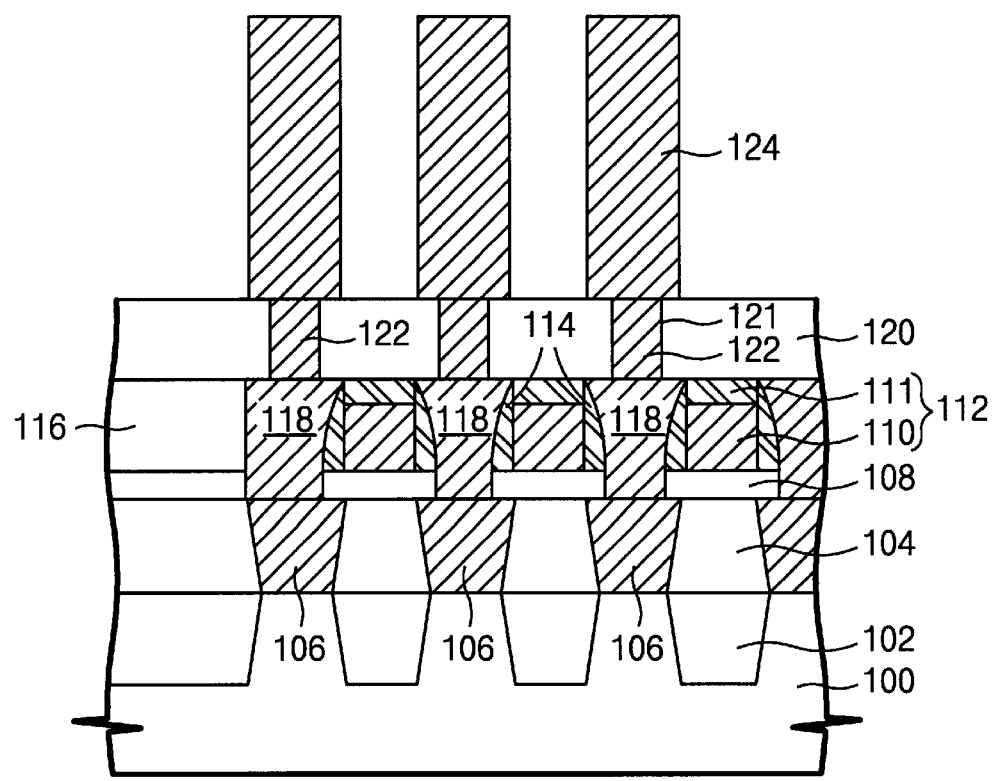

Referring to FIG. 2F, after formation of a storage node formation conductive layer on the fourth insulating layer 120 including the storage node contact hole 121, the conductive layer is etched by using a storage node formation mask. Then, a storage node 124 electrically connected to the storage node contact 122 is formed.

(Second Embodiment)

Figure 3A:
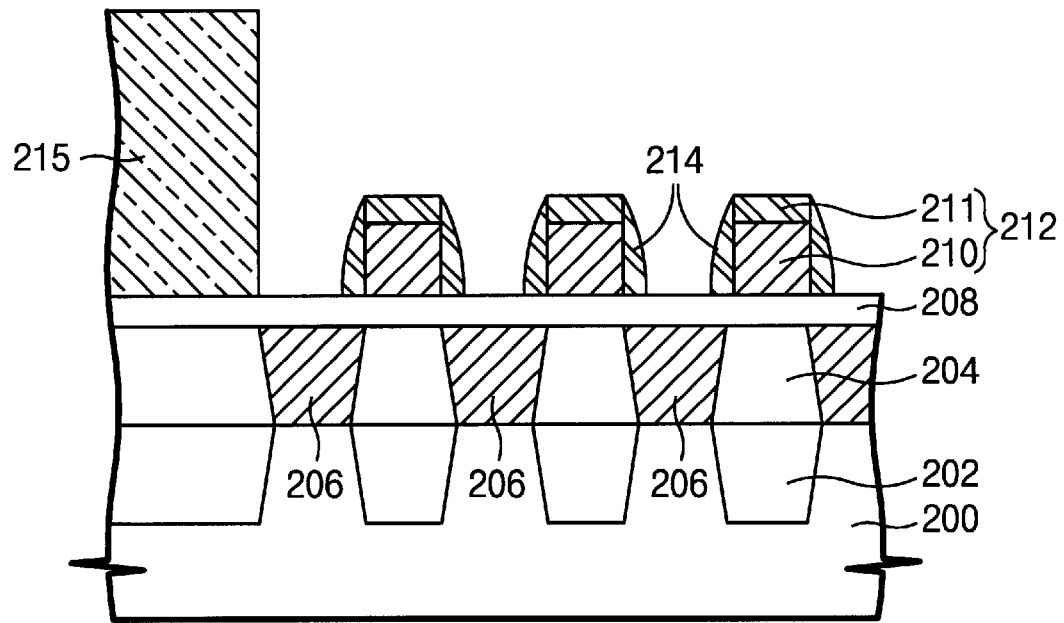
FIGS. 3A–3F are flow diagrams showing the process steps of a method for forming a self-aligned contact according to a Second Embodiment, viewed along the direction parallel with a word line.

Referring to FIG. 3A, the same processes as in the First Embodiment are performed to the bit line formation process, so that a description thereof will be skipped in describing the Second Embodiment.

A nitride layer is formed on a second oxide layer 208 including the bit line. Anisotropically etching the nitride layer through the etch-back process, a bit line spacer 214 is formed on both sidewalls of the bit line 212.

Figure 3B:
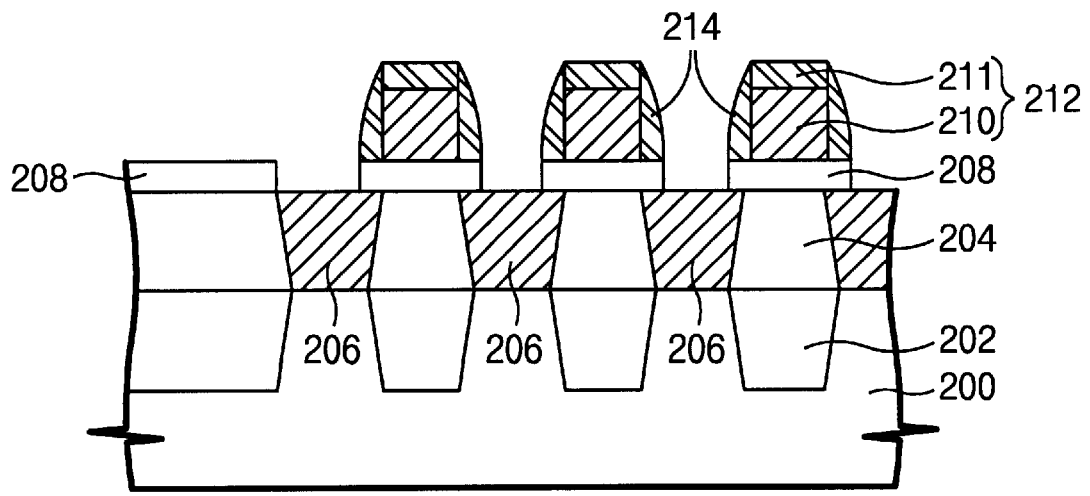
Figure 5:
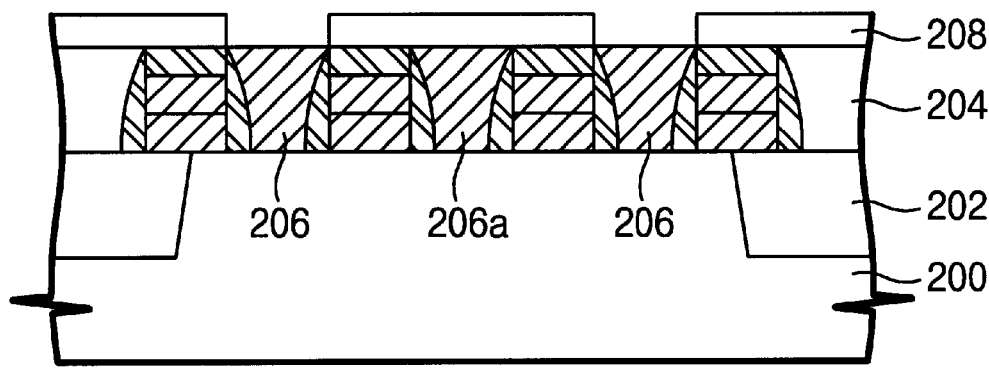
FIG. 5 is a sectional view showing a self-aligned contact according to a Second Embodiment, viewed along the direction parallel with a bit line.

Referring to FIG. 3B and FIG. 5, using a photoresist pattern 215 and a mask nitride layer 211 as a mask, the second oxide layer 208 is removed down to a top surface of a first self-aligned contact pad 206 with a portion for defining a second self-aligned contact pad left.

Figure 3C:
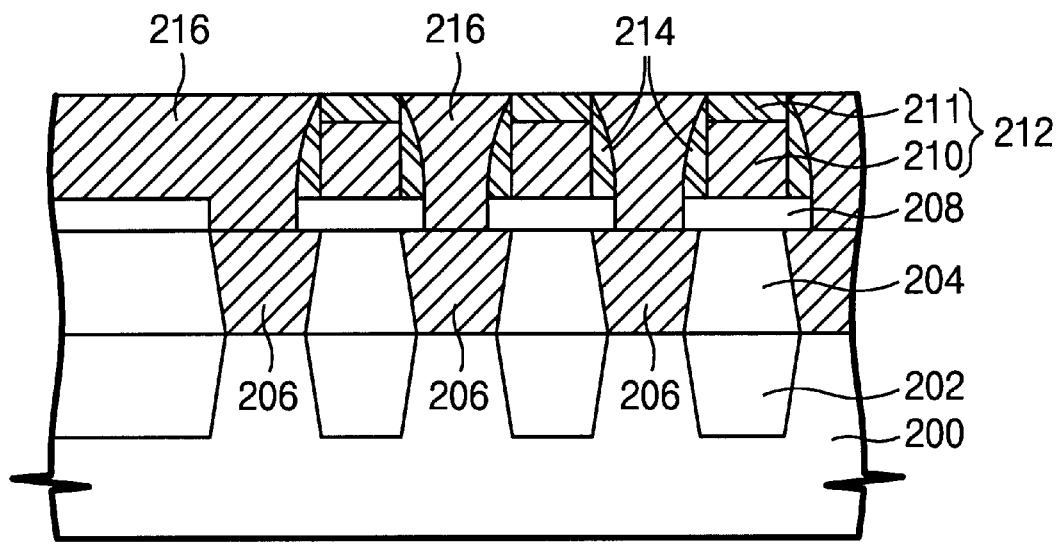

Referring to FIG. 3C, a self-aligned contact pad formation polysilicon layer 216a is formed on the first self-aligned contact pad 206 and the second oxide layer 208 including the bit line 212. Afterwards, the polysilicon layer 216a is planarized down to a top surface of the mask nitride layer 211 through the CMP process.

Figure 3D:
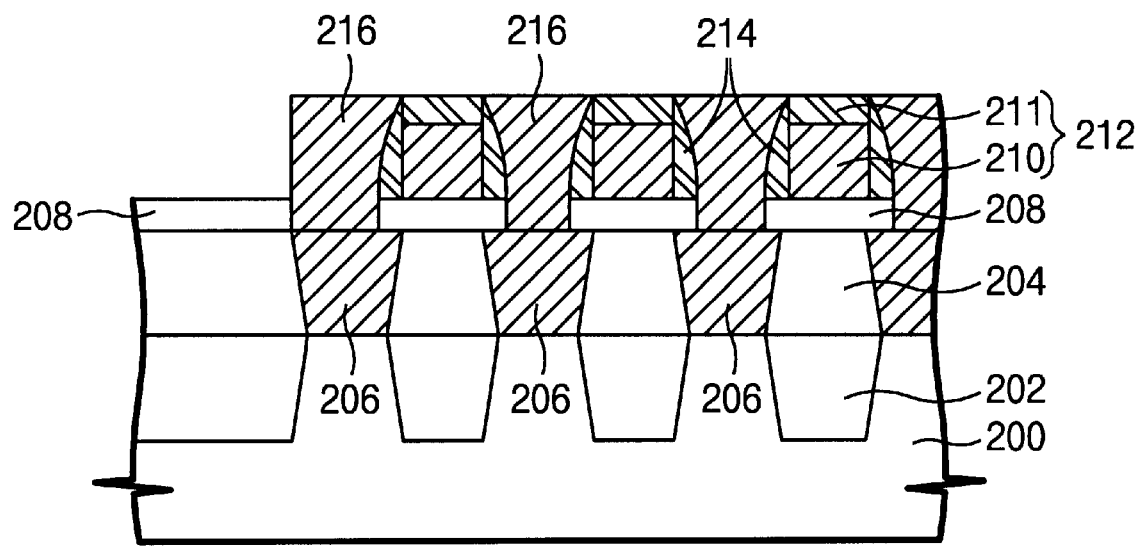
Figure 6:
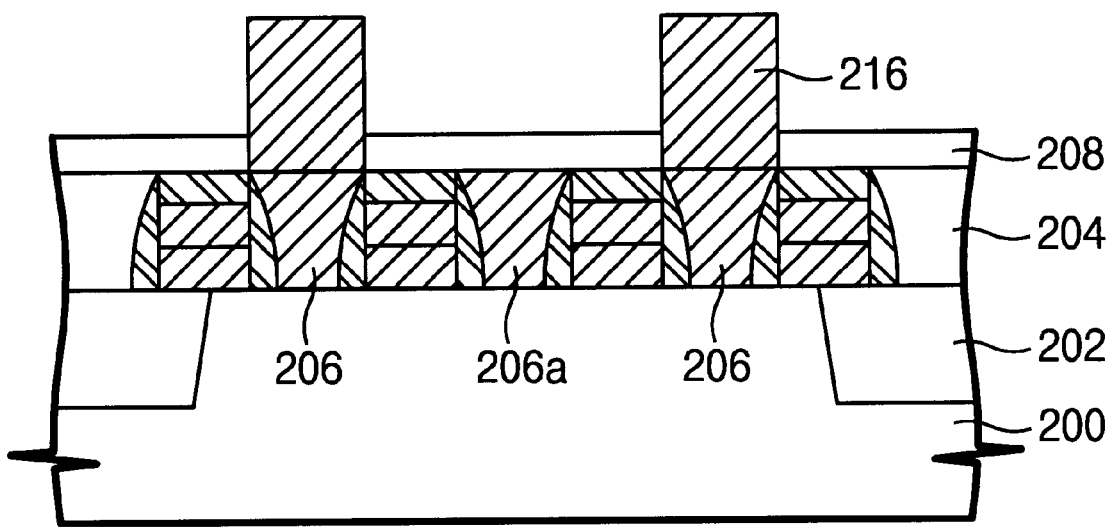
FIG. 6 is a sectional view showing a self-aligned contact according to a second embodiment, viewed along the direction parallel with a bit line.

Referring to FIG. 3D and FIG. 6, using a self-aligned contact pad formation mask, polysilicon layer 216a is removed except a second self-aligned contact pad 216 electrically connected to the first self-aligned contact pad 206.

Figure 3E:
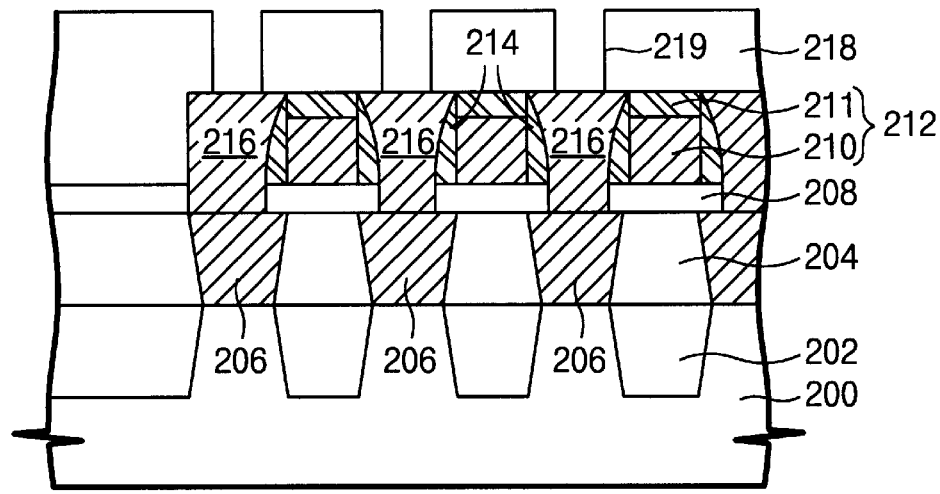

Referring to FIG. 3E, after formation of a third oxide layer 218 on the overall surface of the semiconductor substrate 200, the third oxide layer 218 is planarized through the CMP process. After the CMP process, the third oxide layer 218 left on the bit line 212 has a thickness range of about 1,000 to 2,000 Å. Using a storage node contact hole formation mask, the third oxide layer 218 is etched down to a top surface of the second self-aligned contact pad 216. Then, a storage node contact hole 219 is formed.

Figure 3F:
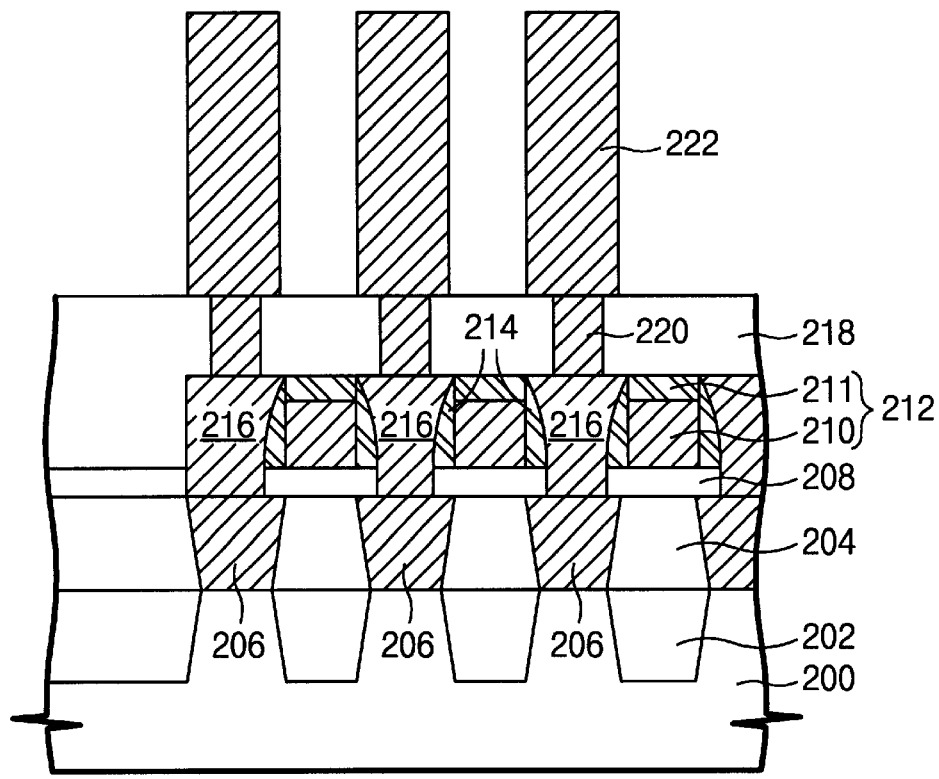

Referring to FIG. 3F, a storage node formation conductive layer is formed on the third oxide layer 218 including the foregoing contact hole 219. Afterwards, using a storage node formation mask, the conductive layer is patterned to form a storage node 222 electrically connected to the storage node contact 220.

A multi-layer self-aligned contact pad is formed in the present invention. Accordingly, the contact is self-aligned to a gate electrode and a bit line, thereby preventing shorts generated by misalignment. Further, the etching thickness is reduced while etching the oxide layer so as to form a storage node contact hole, thereby suppressing shorts and reducing the critical dimension of a storage node contact. As a result, it is possible to insure misalignment margin to a storage node.

The invention has been described in detail with particular reference to preferred embodiments thereof, but it will be understood that variations and modifications can be effected within the sprit and scope of the invention.

What is claimed is:

1. A method for forming a self-aligned contact comprising:

forming a first insulating layer on a semiconductor substrate where a transistor is formed;

forming a first self-aligned contact pad in said first insulating layer to be electrically connected to said semiconductor substrate outside of said transistor;

forming a second insulating layer on said first insulating layer, including said first self-aligned contact pad;

forming a conductive architecture on said second insulating layer, said conductive architecture being covered with a material layer having an etch selectivity with respect to said second insulating layer;

forming a third insulating layer on said second insulating layer, including said conductive architecture;

using a photoresist pattern and sequentially etching said third insulating layer and said second insulating layer down to a top surface of said first self-aligned contact pad, to form a first opening;

forming a second self-aligned contact pad electrically connected to said first self-aligned contact pad via said first opening;

forming a fourth insulating layer on said third insulating layer including said second self-aligned contact pad;

etching said fourth insulating layer down to a top surface of said second self-aligned contact pad, to form a second opening; and forming a storage node electrically connected to said second self-aligned contact pad via said second opening.

2. The method of claim 1, wherein said first, said second, said third, and said fourth insulating layers are made of oxide, and said material layer is made of silicon nitride.

3. The method of claim 1, wherein said fourth insulating layer is formed with a thickness of about 1,000 to 2,000 Å.

4. The method of claim 1, wherein said conductive architecture is a bit line.

5. The method of claim 1, wherein said photoresist pattern has a linear opening that exposes at least two underlying contact areas.

6. A method for forming self-aligned contact comprising:

forming a first insulating layer on a semiconductor substrate where a transistor is formed;

forming a first self-aligned contact pad in said first insulating layer to be electrically connected to said semiconductor substrate outside of said transistor;

forming a second insulating layer on said first insulating layer including said first self-aligned contact pad;

forming spaced apart conductive architectures on said second insulating layer, said conductive architectures being covered with a material layer having an etch selectivity with respect to said second insulating layer;

etching said second insulating layer between said conductive architectures down to a top surface of said first self-aligned contact pad by using a photoresist pattern as a mask, defining an area for a second self-aligned contact pad;

forming a pad formation conductive layer on said conductive architectures and on a space therebetween;

planarizing said pad formation conductive layer down to a top surface of said material layer of said conductive architectures;

patterning said pad formation conductive layer to form a second self-aligned contact pad electrically connected to said first self-aligned contact pad;

forming a third insulating layer on said second insulating layer, including said second self-aligned contact pad;

etching said third insulating layer down to a top surface of said second self-aligned contact pad to form an opening; and forming a storage node electrically connected to said second self-aligned contact pad via said opening.

7. The method of claim 6, wherein said photoresist pattern has a linear opening that exposes at least two contact areas.

* * * * *